United States Patent
Nishihara

(10) Patent No.: US 6,546,941 B1
(45) Date of Patent: Apr. 15, 2003

(54) WAFER CLEANING DEVICE, WAFER CLEANING METHOD AND CHEMICAL MECHANICAL POLISHING MACHINE

(75) Inventor: Jun Nishihara, Kagoshima (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/493,074

(22) Filed: Jan. 28, 2000

(30) Foreign Application Priority Data

Feb. 5, 1999 (JP) ............................................ 11-028065

(51) Int. Cl.$^7$ ............................. B08B 3/00; A47L 25/00
(52) U.S. Cl. ......................... 134/157; 134/902; 115/77; 115/88.3
(58) Field of Search .......................... 15/77, 88.2, 88.3, 15/102; 134/157, 902

(56) References Cited

U.S. PATENT DOCUMENTS

| | | | | |
|---|---|---|---|---|
| 1,678,064 A | * | 7/1928 | Jones et al. ................... | 15/56 |
| 4,199,150 A | * | 4/1980 | Chung ......................... | 15/88.3 |
| 5,375,291 A | * | 12/1994 | Tateyama et al. ............. | 15/302 |
| 5,862,560 A | * | 1/1999 | Jensen et al. .................. | 15/77 |
| 6,059,889 A | * | 5/2000 | Jensen et al. .................. | 134/6 |
| 6,290,780 B1 | * | 9/2001 | Ravkin ......................... | 134/6 |
| 2001/0010103 A1 | * | 8/2001 | Konishi et al. ................. | 15/77 |

FOREIGN PATENT DOCUMENTS

JP          11-238713       *   8/1999       ......... H01L/21/304

* cited by examiner

Primary Examiner—Randy Golakowski
Assistant Examiner—Joseph Perrin
(74) Attorney, Agent, or Firm—Rader, Fishman & Grauer PLLC; Ronald P. Kananen, Esq.

(57) ABSTRACT

A wafer cleaning device is provided with a roll brush extending in an axial direction and having an end portion supported so that the roll brush can be rolled around its axis freely for performing cleaning by touching a rolled contact surface of the roll brush to a cleaned surface of a wafer. The end portion of the roll brush is supported so that the roll brush can be displaced by a dial adjusting screw to enable the axis to be tilted to the cleaned surface of the wafer.

17 Claims, 5 Drawing Sheets

PART WHERE
SURFACE
PRESSURE
IS LOW

WAFER CLEANING DEVICE, WAFER CLEANING METHOD AND CHEMICAL MECHANICAL POLISHING MACHINE

BACKGROUND OF THE INVENTION

1. Field of the Invention

The present invention relates to a wafer cleaning device, a wafer cleaning method and a chemical mechanical polishing (CMP) machine using them respectively suitable for using for cleaning processing after flattening in a CMP machine for example.

2. Description of the Related Art

In a wafer processing process when system LSI is manufactured, the irregularities of an interlayer between wires are flattened using chemical abrasive by a CMP machine. Particles and chemical abrasive that adhere to the flattened wafer are removed by cleaning by a wafer cleaning device. Heretofore, a wafer cleaning device provided with a roll brush is known. In this type of wafer cleaning device, as shown in FIG. 9, cleaning is performed by rolling a roll brush 1 made of soft material such as polyurethane and touching its rolled contact surface to the cleaned surface 3 of a wafer W. As for the roll brush 1, one end in the direction of an axis is supported by a supporting section 5 so that the roll brush can be rolled around the axis freely as shown in FIG. 10. In the above conventional type example, a driven roll 7 which can be rolled freely is arranged on the reverse side (on the lower side shown in FIG. 10) of the roll brush 1 with the wafer W in the center. Therefore, the wafer W is held by the roll brush 1 and the drive roll 7 and the cleaned surface 3 is cleaned, being pressed by the rolled roll brush 1.

Heretofore, plural wafer cleaning devices provided with the same structure are provided in a cleaning processing process and each wafer after flattening processing is distributed in the plural wafer cleaning devices and parallel processing is performed.

However, as a result of measuring particles on a wafer cleaned by a wafer cleaning device, it becomes clear that the above plural wafer cleaning devices are different in wafer cleaning ability though they have the same structure. As a result of examining a factor of the difference made among the devices, it becomes clear that the above difference is related to parallelism shown in FIG. 11 between the wafer W and the roll brush 1.

However, in the conventional type wafer cleaning device, for parallelism between the wafer and the roll brush, a criterion is not particularly provided. Therefore, the above parallelism is determined when the device is assembled, depends upon the precision of a part and the precision of assembly and is actually not controlled.

As a mechanism for adjusting parallelism between the wafer and the roll brush is not provided, parallelism is required to be adjusted by inserting a shim (a spacer for adjusting clearance) between parts and others in case the parts are to be kept in parallel, complicated skilled technique is required and quantitative adjustment is disabled.

Further, there is a problem that even if parallelism is set to an optimum value, it is difficult to continue to kept the parallelism and as means for detecting the change of the parallelism is not provided, the current parallelism is not guaranteed.

SUMMARY OF THE INVENTION

The present invention is made in view of the above situation and the object is to provide a wafer cleaning device and others wherein quantitative parallelism can be simply and promptly acquired and in addition, the change of parallelism can be grasped.

A wafer cleaning device according to the present invention to achieve the above object is based upon a wafer cleaning device provided with a roll brush one end in an axial direction of which is supported so that the above roll brush can be rolled around the axis freely wherein cleaning is performed by touching the rolled contact surface of the rolled roll brush to the cleaned surface of a wafer and is characterized in that one end of a roll brush is supported so that the roll brush can be displaced by adjustment means to enable its axis to be tilted to the cleaned surface of a wafer. Also, one end of a rollable driven roll arranged on the reverse side of the above roll brush may be also supported by the adjustment means so that the roll brush can be displaced to enable its axis to be tilted to the cleaned surface of a wafer and each one end of the roll brush and the driven roll may be also supported so that the roll brush can be displaced by the adjustment means to enable each axis of both to be tilted to the cleaned surface of the wafer. Hereby, minute adjustment the degree of freedom of which is high is also enabled.

In the above wafer cleaning device, a position in which one end of the roll brush is supported is displaced and the axis of the roll brush is tilted to the cleaned surface of a wafer by rolling and adjusting a dial adjusting screw which is the above adjustment means manually. Hereby, positional adjustment between the cleaned surface and the roll brush is quantitatively enabled without requiring skilled technique.

The above wafer cleaning device is also characterized in that displacement detecting means for detecting the change of distance between the cleaned surface of a wafer and the roll brush is provided. Control means for feeding back the result of detection by the above displacement detecting means and automatically adjusting the above adjustment means may be also provided. Hereby, cleaning can be promptly performed at precise parallelism.

According to the wafer cleaning device, the change of distance between the cleaned surface and the roll brush is grasped by the displacement detecting means and cleaning by the roll brush in a state in which parallelism is deteriorated can be prevented beforehand. Hereby, the adhesion of particles and slurry to a wafer is prevented from being increased by cleaning by the roll brush the parallelism of which is deteriorated.

The wafer cleaning device is also characterized in that parallelism between the facing surface parallel to the axis of the above rolled contact surface and the cleaned surface of a wafer is set to 0.1 mm or less.

In the wafer cleaning device, the deterioration of the cleaning ability of the roll brush which becomes remarkable in case the parallelism is more than 0.1 mm is prevented and particles and slurry are removed by the very high cleaning ability of the roll brush (the above numerical value is the case of a wafer 8 inches (20 cm) in diameter, however, it hardly need be said that optimum parallelism also increases as the number of the inch of a wafer increases).

The present invention also discloses a method of cleaning a wafer to achieve the above object. That is, a method of cleaning a wafer according to the present invention is characterized in that one end of the roll brush is supported so that the roll brush can be displaced by adjustment means to enable the above axis to be tilted to the cleaned surface of a wafer in a process for touching the rolled contact surface of the roll brush one end in an axial direction of which is supported so that the roll brush can be rolled around the axis freely to the cleaned surface of a wafer and a method of cleaning a wafer by rolling the roll brush.

In the wafer cleaning method, a position in which one end of the roll brush is supported is displaced and the axis of the roll brush is tilted to the cleaned surface of a wafer by rolling and adjusting a dial adjusting screw which is the above adjustment means manually. Hereby, the adjustment of quantitative position between the cleaned surface and the roll brush is enabled without requiring skilled technique.

The wafer cleaning method is also characterized in that a displacement detecting process for detecting the change of distance between the cleaned surface of a wafer and the roll brush is provided. A control process for feeding back the result of detection in the displacement detecting process and automatically adjusting the above adjustment means may be also provided. Hereby, cleaning can be promptly performed at precise parallelism.

In the wafer cleaning method, the change of distance between the cleaned surface and the roll brush is grasped in the displacement detecting process and cleaning by the roll brush in a state in which parallelism is deteriorated can be prevented beforehand. Hereby, the adhesion of particles and slurry to a wafer is prevented from being increased by cleaning by the roll brush the parallelism of which is deteriorated.

The wafer cleaning method is also characterized in that parallelism between the facing surface parallel to the axis of the rolled contact surface and the cleaned surface of a wafer is set to 0.1 mm or less.

In the wafer cleaning method, the deterioration of the cleaning ability of the roll brush which becomes remarkable when parallelism is larger than 0.1 mm is prevented and particles and slurry are removed by the always high cleaning ability of the roll brush (the above numerical value is the case of a wafer 8 inches (20 cm) in diameter, however, it hardly need be said that optimum parallelism also increases as the number of the inch of a wafer increases).

To achieve the above object, the present invention also discloses a chemical mechanical polishing machine. That is, the chemical mechanical polishing machine according to the present invention is characterized in that it is provided with a polishing module and a cleaning module, the cleaning module is provided with a roll brush one end in an axial direction of which is supported so that the roll brush can be rolled around the axis freely, cleaning is performed by touching the rolled contact surface-of the rolled roll brush to the cleaned surface of a wafer and one end of the roll brush is supported so that the roll brush can be displaced by roll brush adjustment means to enable the axis to be tilted to the cleaned surface of a wafer. One end of a rollable driven roll arranged on the reverse side of the roll brush may be also supported so that the roll brush can be displaced by the adjustment means to enable the axis to be tilted to the cleaned surface of a wafer and each one end of both of the roll brush and the driven roll may be also supported so that the roll brush can be displaced by the driven roll adjustment means to enable the axis to be tilted to the cleaned surface of a wafer. Hereby, minute adjustment is also enabled.

Also, in the chemical mechanical polishing machine, a position in which one end of the roll brush is supported is displaced by rolling and adjusting a dial adjusting screw which is the above adjustment means manually and the axis of the roll brush is tilted to the cleaned surface of a wafer. Hereby, positional adjustment between the cleaned surface and the roll brush can be quantitatively made without requiring skilled technique.

The chemical mechanical polishing machine is also characterized in that displacement detecting means for detecting the change of distance between the cleaned surface of a wafer and the roll brush is provided. Further, control means for feeding back the result of detection by the displacement detecting means and automatically adjusting the adjustment means may be also provided. Hereby, cleaning can be promptly performed at precise parallelism.

In the chemical mechanical polishing machine, the change of distance between the cleaned surface and the roll brush is grasped by the displacement detecting means and cleaning by the roll brush in a state in which parallelism is deteriorated can be prevented beforehand. Hereby, the adhesion of particles and slurry to a wafer is prevented from being increased by cleaning by the roll brush the parallelism of which is deteriorated.

The chemical mechanical polishing machine is also characterized in that parallelism between the facing surface parallel to the axis of the rolled contact surface and the cleaned surface of a wafer is set to 0.1 mm or less.

In the chemical mechanical polishing machine, the deterioration of the cleaning ability of the roll brush which becomes remarkable when parallelism is larger than 0.1 mm is prevented and particles and slurry are removed by the always high cleaning ability of the roll brush (the above numerical value is the case of a wafer 8 inches (20 cm) in diameter, however, it hardly need be said that optimum parallelism also increases as the number of the inch of a wafer increases).

DESCRIPTION OF THE PREFERRED EMBODIMENT

Figure 1:
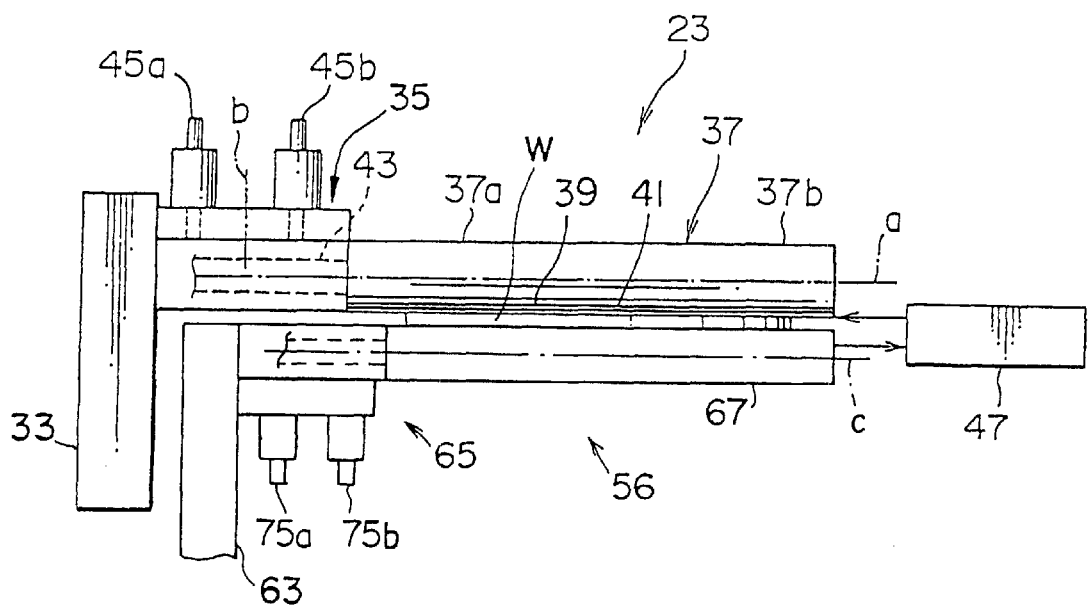
FIG. 1 is a side view showing the schematic configuration of a wafer cleaning device according to the present invention.

Referring to the drawings, preferred embodiments of a wafer cleaning device, a wafer cleaning method and a chemical mechanical polishing machine respectively according to the present invention will be described in detail below.

Figure 2:
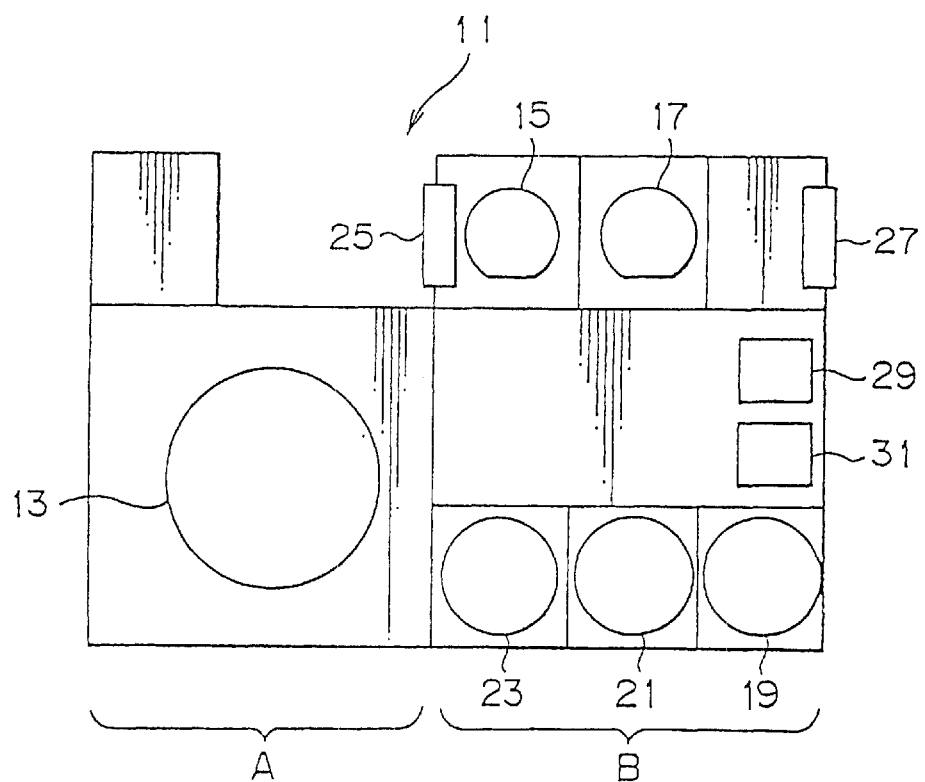
FIG. 2 is a plan showing the schematic configuration of a chemical mechanical polishing machine according to the present invention provided with the wafer cleaning device shown in FIG. 1.

FIG. 1 is a side view showing the schematic configuration of a wafer cleaning device according to the present invention and FIG. 2 is a plan showing the schematic configuration of a chemical mechanical polishing (CMP) machine according to the present invention provided with the wafer cleaning device shown in FIG. 1.

As shown in FIG. 2, the CMP machine 11 is roughly classified into a polishing module A and a cleaning module B. In the polishing module A, a polishing turn table 13 is provided. In the cleaning module B, a wafer inverting unit Wet 15, a wafer inverting unit Dry 17, a cleaning unit MS 19, a cleaning unit DHF 21 and a roll brush cleaning unit 23 related to this embodiment are provided. A reference number 25 shown in FIG. 2 denotes a back-face control panel, 27 denotes a surface control panel, 29 denotes a loader and 31 denotes an unloader.

As shown in FIG. 1, a supporting frame 33 is provided to the roll brush cleaning unit 23. A bearing 35 is formed in the supporting frame 33. The bearing 35 supports one end in the direction of an axis a of a roll brush 37 so that the roll brush can be rolled around the axis a freely. The roll brush 37 is made of soft material such as polyurethane and is formed in the shape of a bar the cross section in a direction perpendicular to the axis a of which is circular. The roll brush cleaning unit 23 may be also provided with a driven roll (not shown).

The roll brush 37 is rolled by rolling means not shown and cleaning is performed by touching the rolled contact surface to the cleaned surface 39 of a wafer W. Therefore, the roll brush 37 touches the facing surface 41 parallel to the axis a of the rolled contact surface to the cleaned surface 39.

The axis center 43 of the roll brush 37 is inserted into the bearing 35 and is supported so that it can be rolled. A position equivalent to approximately a half of distance by which the roll brush is inserted into the bearing 35 functions as a support b and the axis center 43 is supported so that it can be rolled. Two dial adjusting screws 45a and 45b which are adjustment means are provided with the support b between them in the bearing 35. The dial adjusting screws 45a and 45b are constituted so that they press the axis center 43 by turning them manually. Needless to say, as for the adjustment means, various variations can be adopted in addition to the dial adjusting screw. It is clear that even if the mechanism not shown is provided to the driven roll, the effect of the present invention is produced.

The base 37a of the roll brush 37 becomes lower than the end 37b when the dial adjusting screw 45a is turned in a direction in which the above screw presses the axis center 43. Also, the end 37b of the roll brush 37 becomes lower than the base 37a when the dial adjusting screw 45b is turned in a direction in which the above screw presses the axis center 43. That is, the roll brush 37 is supported by the bearing 35 so that the axis center 43 can be displaced. Hereby, the axis a (the facing surface 41) of the roll brush 37 can be tilted to the cleaned surface 39.

Also, as shown in FIG. 1, a second supporting frame 63 is provided to a driven roll unit 56. A second bearing 65 is formed in the second supporting frame 63. The bearing 65 supports one end of a driven roll 67 so that the driven roll 67 can be rolled about a roll axis c. Similar in configuration and identical in operation as discussed above for the roll brush cleaning unit 23, second dial adjusting screws 75a and 75b are operatively connected to the second bearing 65 as driven roll adjustment means to adjust the roll axis c.

In the vicinity of the roll brush 37, a laser beam displacement gage 47 which is displacement detecting means is provided. The laser beam displacement gate 47 can detect the change of distance between the cleaned surface 39 of the wafer W and the roll brush 37 by irradiating a laser beam for example and receiving reflected light without coming in contact with the roll brush 37. However, the displacement detecting means is not limited to the laser beam displacement gage 47 if the change of distance between the cleaned surface 39 and the roll brush 37 can be detected. Control means not shown for automatically adjusting the dial adjusting screws 45a and 45b based upon the result of detection by the laser beam displacement gage can be also provided.

Next, the action of the wafer cleaning device 23 composed as described above will be described.

After CMP processing is executed on the polishing turn table 13 of the polishing module A, post-treatment cleaning for removing abrasive grain slurry for polishing is applied to the wafer W by the roll brush cleaning unit 23.

The roll brush 37 in the roll brush cleaning unit 23 is set by adjusting the dial adjusting screws 45a and 45b so that parallelism to the cleaned surface 39 is a predetermined value described in a subsequent embodiment. The value of parallelism is measured as a predetermined value by the laser beam displacement gage 47.

The roll brush 37 the parallelism of which is set to the predetermined value removes particles and slurry which adhere to the cleaned surface 39 by rolling the roll brush by rolling means not shown and touching it to the cleaned surface 39 of the wafer W.

If parallelism between the roll brush 37 and the cleaned surface 39 changes because the cleaning of plural wafers W is repeated, the displacement is detected by the laser beam displacement gage 47. In this case, the roll brush 37 is adjusted by manually or automatically adjusting the dial adjusting screws 45a and 45b so that the current value of parallelism is a predetermined value of parallelism.

In the wafer cleaning device 23, the supported position of the roll brush 37 is displaced by manually or automatically adjusting the dial adjusting screws 45a and 45b, the axis a of the roll brush 37 is tilted to the cleaned surface 39 of the wafer W and positional adjustment between the cleaned surface 39 and the roll brush 37 can be quantitatively performed without requiring skilled technique.

Also, the change of distance between the cleaned surface 39 and the roll brush 37 is grasped by the laser beam displacement gage 47 and cleaning by the roll brush 37 in a state in which the parallelism is deteriorated is prevented beforehand by feeding back the result if necessary. Hereby, the adhesion of particles and slurry can to the wafer is prevented from being increased by cleaning by the roll brush 37 the parallelism of which is deteriorated.

Therefore, according to the above wafer cleaning device 23, as positional adjustment between the roll brush 37 and the wafer W can be quantitatively made, anyone can adjust the parallelism of the roll brush 37 to the wafer W simply and promptly. Also, as it is known by the laser beam displacement gage 47 that displacement occurs, the adhesion of particles and slurry to the wafer is prevented from being increased after CMP and the deterioration of the yield of the wafer can be prevented. Needless to say, the present invention is not only used in the cleaning module after CMP but can be used in the post-treatment of various devices.

Next, the result of acquiring a range of desirable parallelism will be described actually using the wafer cleaning device according to the present invention.

Figure 3:
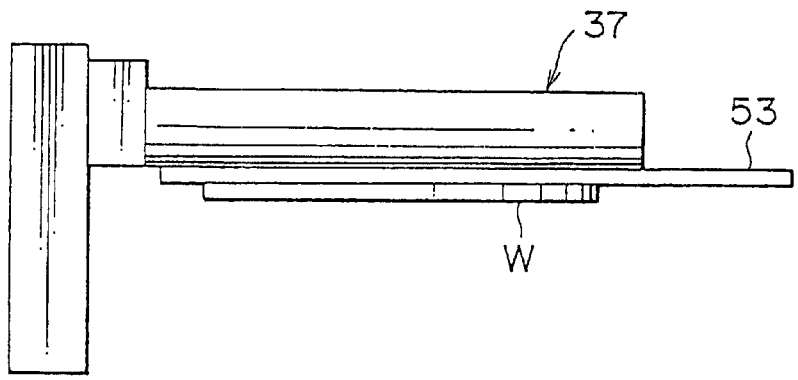
FIG. 3 is an explanatory drawing showing a method of surface pressure measurement of a roll brush.
Figure 4:
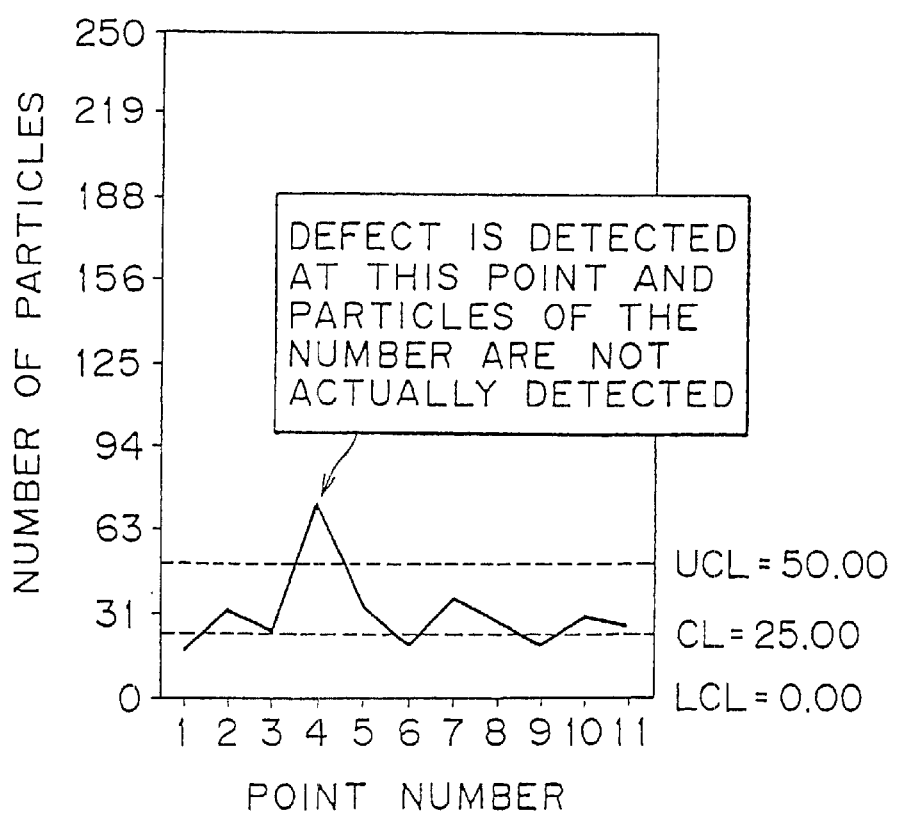
FIG. 4 is a graph showing the measured value of a particle.
Figure 5:
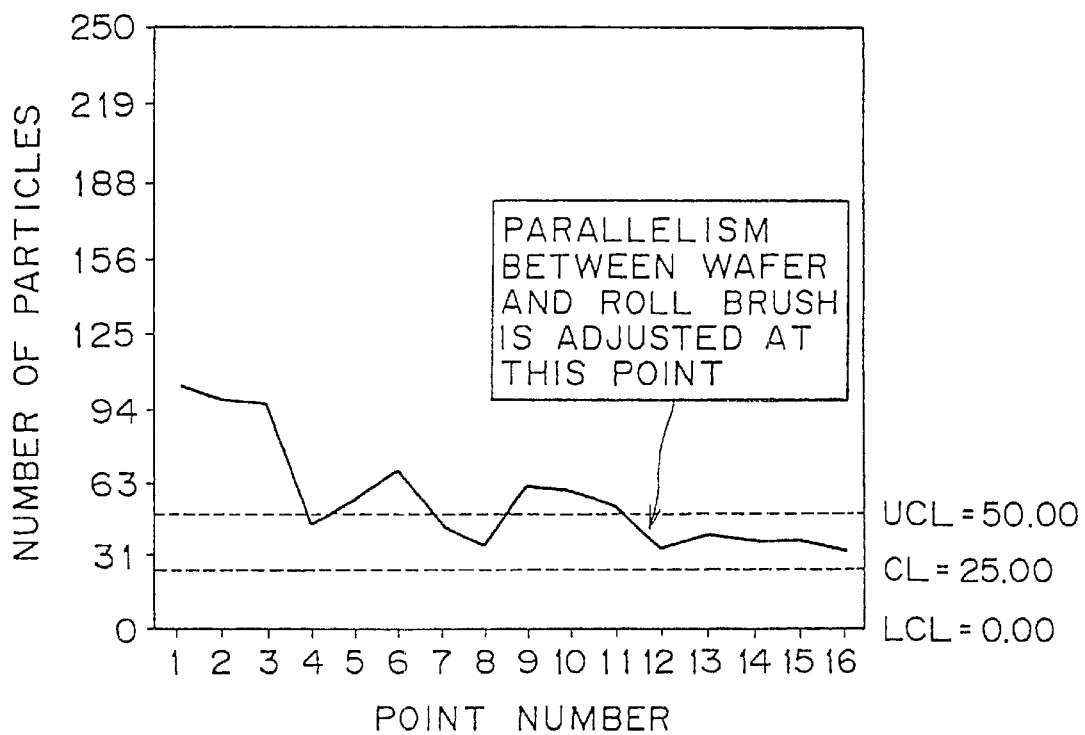
FIG. 5 is a graph showing the measured value of a particle.
Figure 6:
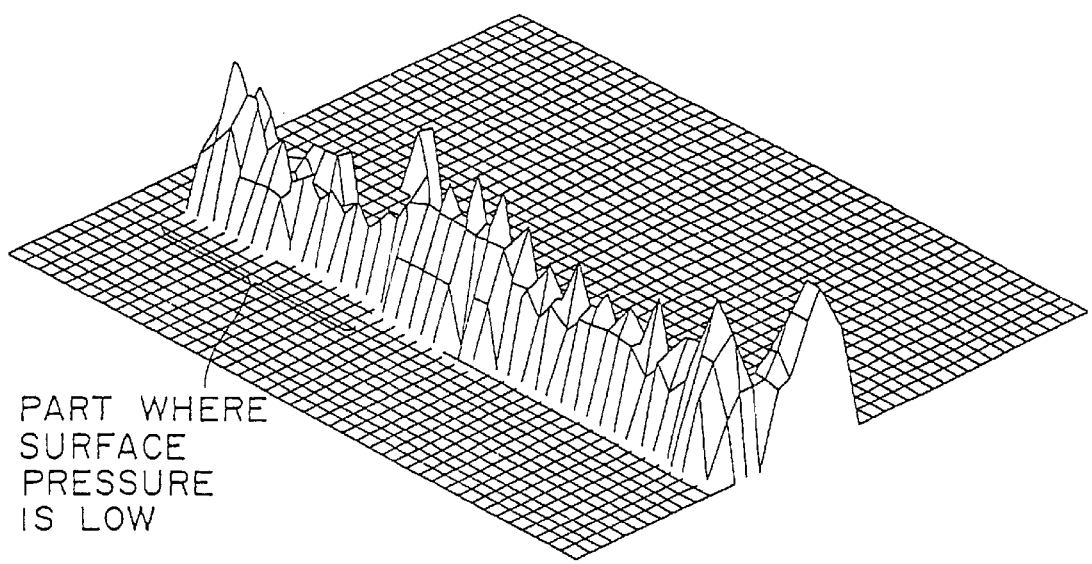
FIG. 6 is a graph showing a measured value by surface pressure when parallelism is 0.5 mm.
Figure 7:
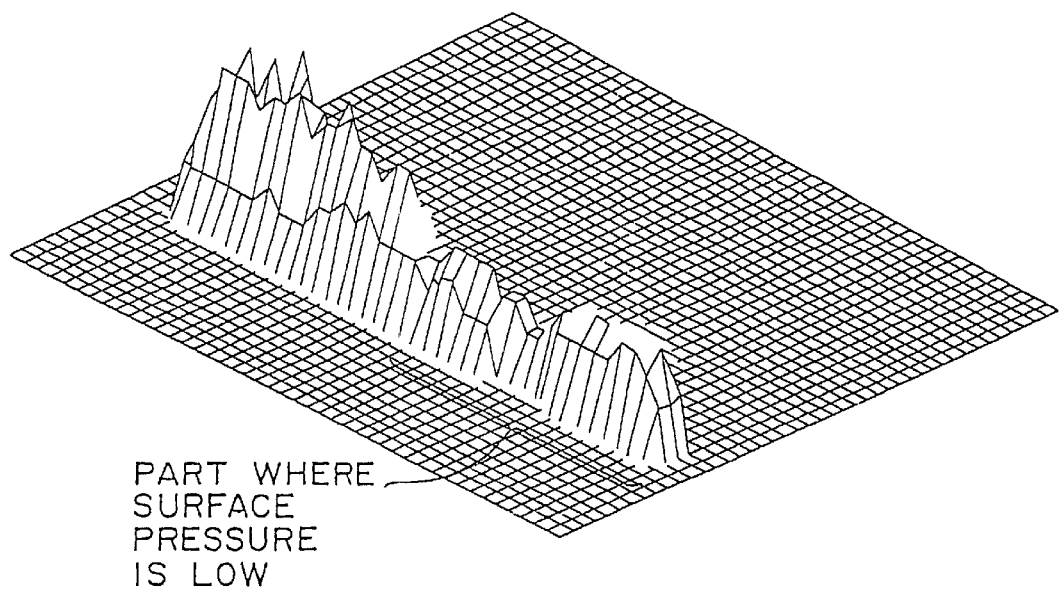
FIG. 7 is a graph showing a measured value by surface pressure when parallelism is 0.2 mm.
Figure 8:
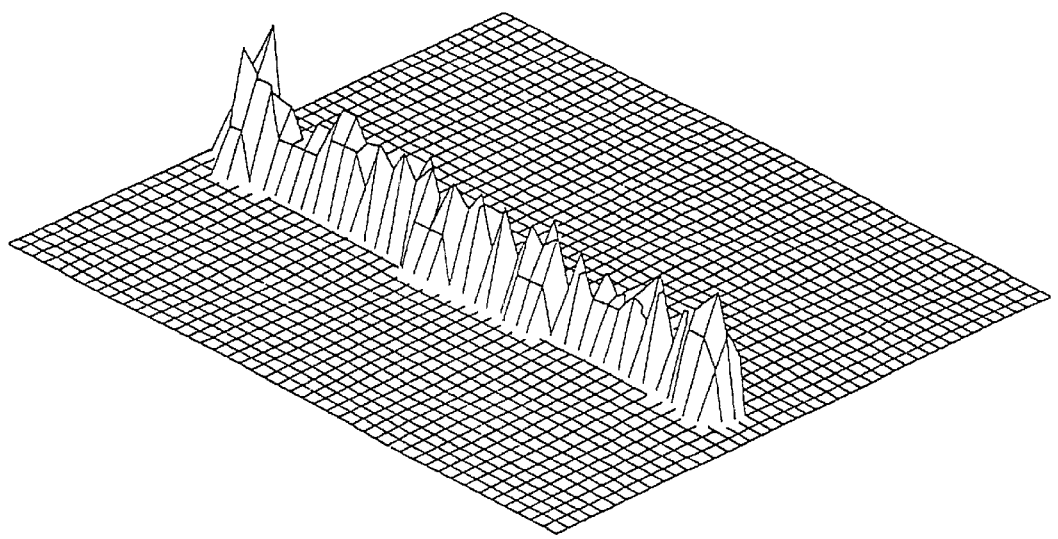
FIG. 8 is a graph showing a measured value by surface pressure when parallelism is 0.1 mm.
Figure 9:
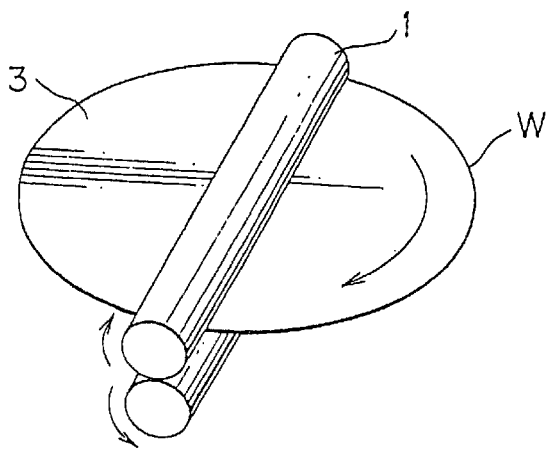
FIG. 9 is a schematic drawing showing a wafer cleaning method in related art.
Figure 10:
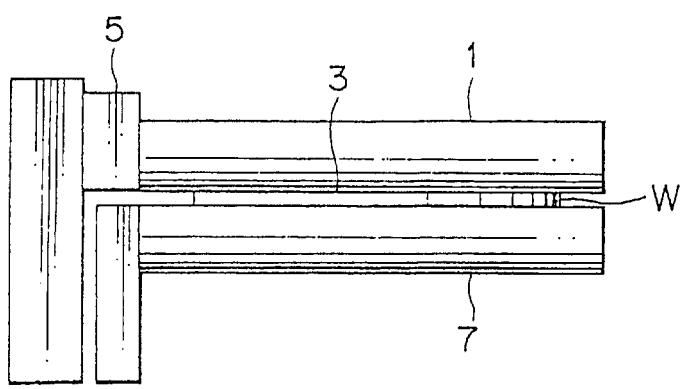
FIG. 10 is a side view showing a wafer cleaning device in related art.
Figure 11:
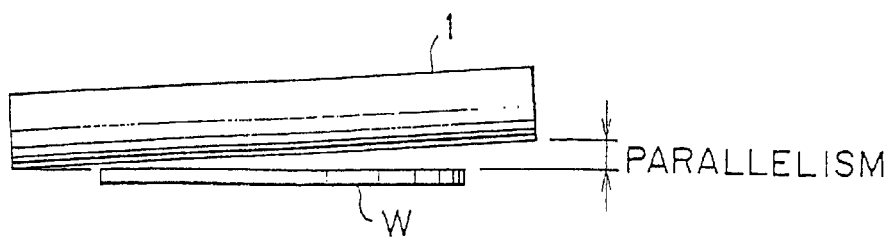
FIG. 11 is an explanatory drawing showing parallelism between a wafer and a roll brush.

FIG. 3 is an explanatory drawing showing a method of surface pressure measurement of the roll brush, FIGS. 4 and 5 are graphs showing the measured value of a particle, FIG. 6 is a graph showing a surface pressure measured value when parallelism is 0.5 mm, FIG. 7 is a graph showing a surface pressure measured value when parallelism is 0.2 mm and FIG. 8 is a graph showing a surface pressure measured value when parallelism is 0.1 mm.

FIGS. 4 and 5 show that the measured values of a particle are different in wafer cleaning devices with the same specifications. In FIGS. 4 and 5, the x-axis shows a measurement point (Points are arranged according to time series. As it goes to right, data becomes newer) and the y-axis shows the number of particles. When the number of particles reaches 50, they are controlled.

FIG. 4 shows a stable state in which the number of particles is 50 pieces or less from the beginning. In the meantime, FIG. 5 shows a state in which the number of particles is 50 pieces or more from the beginning. Parallelism between the wafer and the roll brush is adjusted so that it is 0.1 mm (the base of the roll brush is lower) immediately before measurement at a point 12 on the x-axis shown in FIG. 5. The subsequent measured number of particles is 50 pieces or less and decreases. Parallelism between the wafer and the roll brush before measurement at the point 12 on the x-axis shown in FIG. 5 is 0.5 mm (the end of the roll brush is lower).

Also, as shown in FIG. 3, surface pressure measurement is made with a load cell 53 between the roll brush 37 and the wafer W. As for surface pressure measurement, a state in which the roll brush 37 is in contact with the wafer W is set to 0 and surface pressure is measured in a state in which the roll brush 37 is pressed upon the wafer by 1.8 mm. The quantity of pressure of 1.8 mm is similar to a normal manufacturing condition.

FIG. 6 shows a monitor of surface pressure before measurement at the point 12 on the x-axis shown in FIG. 5. When the base of the roll brush is higher by 0.5 mm, a part in which surface pressure is low is located on the side of the base of the roll brush.

FIG. 7 shows surface pressure when parallelism between the wafer and the roll brush is 0.2 mm (the side of the end of the roll brush is higher). At this time, a part in which surface pressure is low is located on the side of the end of the roll brush which is reverse to the case shown in FIG. 6.

FIG. 8 show surface pressure when parallelism between the wafer and the roll brush is 0.1 mm (the side of the base of the roll brush is higher). In FIG. 8, surface pressure is substantially uniform.

Therefore, it proves from data showing the reduction of particles and the drawings showing surface pressure that the parallelism between the wafer and the roll brush of 0.1 mm or less is required to secure uniform surface pressure. In other words, it proves by setting parallelism to 0.1 mm or less that uniform surface pressure is secured, the satisfactory removal of particles and slurry can be executed and the yield of wafers is enhanced (It hardly need be said that as the above result is the result in case the present invention is applied to a wafer 8 inches in diameter, optimum parallelism changes according to the size of a wafer in a wafer 12 inches in diameter in future and others. For example, as for a wafer 12 inches in diameter which is 1.5 times in size, the parallelism of 0.15 mm or less is desirable).

As described above in detail, according to the wafer cleaning device and the CMP machine according to the present invention, as one end of the roll brush or/and the driven roll is supported so that the roll brush can be displaced by the adjustment means to enable the axis to be tilted to the cleaned surface of a wafer, positional adjustment between the cleaned surface and the roll brush can be quantitatively made and parallelism between the cleaned surface and the roll brush can be adjusted simply and promptly by an arbitrary operator without depending upon a specific operator having skilled technique in the cleaning module.

Also, according to the wafer cleaning device and the CMP machine according to the present invention, as the displacement detecting means for detecting the change of distance between the cleaned surface of a wafer and the roll brush is provided and the control means that utilizes the result of the detection is provided if necessary, the change of distance between the cleaned surface and the roll brush, that is, the change of the parallelism can be grasped and cleaning by the roll brush in a state in which the parallelism is deteriorated can be prevented beforehand. As a result, the adhesion of particles and slurry to the wafer is prevented from being increased and the yield of wafers can be enhanced.

Further, according to the wafer cleaning device according to the present invention, as parallelism between the facing surface parallel to the axis of the rolled contact surface and the cleaned surface of a wafer is set to 0.1 mm or less, the deterioration of the cleaning ability of the roll brush which becomes remarkable when the parallelism is 0.1 mm or more can be prevented and particles and slurry can be removed by the always high cleaning ability.

Also, according to the wafer cleaning method according to the present invention, as cleaning is performed using the roll brush wherein the axis can be tilted to the cleaned surface of a wafer and one end is supported so that the roll brush can be displaced by the adjustment means, positional adjustment between the cleaned surface and the roll brush can be quantitatively made and parallelism between the cleaned surface and the roll brush can be adjusted simply and promptly by an arbitrary operator without depending upon a specific operation having skilled technique.

Also, according to the wafer cleaning method according to the present invention, as the displacement detecting process for detecting the change of distance between the cleaned surface of a wafer and the roll brush is provided and the control process for utilizing the result of the detection is provided if necessary, the change of distance between the cleaned surface and the roll brush, that is, the change of parallelism can be grasped and cleaning by the roll brush in a state in which the parallelism is deteriorated can be prevented beforehand. As a result, the adhesion of particles and slurry to a wafer is prevented from being increased and the yield of wafers can be enhanced.

Further, according to the wafer cleaning method according to the present invention, as parallelism between the facing surface parallel to the axis of the rolled contact surface and the cleaned surface of a wafer is set to 0.1 mm or less, the deterioration of the cleaning ability of the roll brush which becomes remarkable when the parallelism is 0.1 mm or more can be prevented and particles and slurry can be removed by the always high cleaning ability.

What is claimed is:

1. A wafer cleaning device, comprising:
   a roll brush extending in an axial direction and having a near end portion, a far end portion and a base portion disposed between the near end portion and the far end portion;
   a support having a bearing extending in the axial direction and sized and adapted to receive the near end portion of the roll brush to support the roll brush in a cantilevered manner so that the base portion and the far end portion project outwardly from the bearing; and adjustment means connected to the support and in contact with the near end portion of the roll brush to enable the axis of the roll brush to be tilted relative to a surface of the wafer to be cleaned, the adjustment means causing the near end portion of the roll brush to move in a seesaw fashion wherein, relative to the surface of the wafer to be cleaned, either the base portion is disposed lower than the far end portion, the far end portion is disposed lower than the base portion or the base portion and the far end portion are disposed equidistantly from the surface of the wafer to be cleaned.

2. A wafer cleaning device according to claim 1, wherein: said adjustment means is at least one dial adjusting screw.

3. A wafer cleaning device, comprising:

a roll brush extending in an axial direction and having a near end roll brush portion, a far end roll brush portion and a base roll brush portion disposed between the near end roll brush portion and the far end roll brush portion;

a driven roll located on a side reverse to said roll brush with the wafer between them and extending in the axial direction and having a near end driven roll portion, a far end driven roll portion and a base driven roll portion disposed between the near end driven roll portion and the far end driven roll portion;

a roll brush support having a roll brush bearing extending in the axial direction and sized and adapted to receive the near end roll brush portion of the roll brush to support the roll brush in a cantilevered manner so that the base roll brush portion and the far end roll brush portion project outwardly from the roll brush bearing;

a driven roll support having a driven roll bearing extending in the axial direction and sized and adapted to receive the near end driven roll portion of the driven roll brush to support the driven roll in a cantilevered manner so that the base driven roll portion and the far end driven roll portion project outwardly from the driven roll bearing;

roll brush adjustment means connected to the roll brush support and in contact with the near end roll brush portion of the roll brush to enable the axis of the roll brush to be tilted relative to a surface of the wafer to be cleaned, the roll brush adjustment means causing the near end roll brush portion of the roll brush to move in a seesaw fashion wherein, relative to the surface of the wafer to be cleaned, either the base roll brush portion is disposed lower than the far end roll brush portion, the far end roll brush portion is disposed lower than the base roll brush portion or the base roll brush portion and the far end roll brush portion are disposed equidistantly from the surface of the wafer to be cleaned; and driven roll adjustment means connected to the driven roll support and in contact with the near end driven roll portion of the driven roll to enable the axis of the driven roll to be tilted relative to the surface of the wafer to the cleaned, the driven roll adjustment means causing the near end driven roll portion of the driven roll to move in a seesaw fashion wherein, relative to the surface of the wafer to be cleaned, either the base driven roll portion is disposed lower than the far end driven roll portion, the far end driven roll portion is disposed lower than the base driven roll portion or the base driven roll portion and the far end driven roll portion are disposed equidistantly from the surface of the wafer to be cleaned.

4. A wafer cleaning device according to claim 3, wherein at least one of the roll brush adjustment means and the driven roll adjustment means includes a pair of dial adjusting screws.

5. A wafer cleaning device according to claim 4, wherein the pair of dial adjusting screws are axially spaced apart from one another.

6. A wafer cleaning device, comprising:

a roll brush extending in an axial direction and having an end portion supported so that the roll brush can be rolled around an axis freely, the end portion of said roll brush being supported so that the roll brush can be displaced by adjustment means to enable the axis of said roll brush to be tilted to the cleaned surface of said wafer; and displacement detecting means for detecting a change of distance between the cleaned surface of said wafer and said roll brush.

7. A wafer cleaning device according to claim 6, further comprising:

control means for adjusting said adjustment means based upon the result of detection by said displacement detecting means.

8. A wafer cleaning device according to claim 1 or 6, wherein:

parallelism between the facing surface parallel to said axis of a rolled contact surface of said roll brush and the cleaned surface of said wafer is set to 0.1 mm or less.

9. A chemical mechanical polishing machine, comprising:

a polishing module; and a cleaning module, wherein:

said cleaning module includes a roll brush extending in an axial direction and having a near end portion, a far end portion and a base portion disposed between the near end portion and the far end portion;

a support having a bearing extending in the axial direction and sized and adapted to receive the near end portion of the roll brush to support the roll brush in a cantilevered manner so that the base portion and the far end portion project outwardly from the bearing; and adjustment means connected to the support and in contact with the near end portion of the roll brush to enable the axis of the roll brush to be tilted relative to a surface of the wafer to be cleaned, the adjustment means causing the near end portion of the roll brush to move in a seesaw fashion wherein, relative to the surface of the wafer to be cleaned, either the base portion is disposed lower than the far end portion, the far end portion is disposed a lower than the base portion or the base portion and the far end portion are disposed equidistantly from the surface of the wafer to be cleaned.

10. A chemical mechanical polishing machine according to claim 9, wherein:

said adjustment means is a dial adjusting screw.

11. A wafer cleaning device according to claim 9, wherein the adjustment means is at least one dial adjusting screw.

12. A chemical mechanical polishing machine, comprising:

a polishing module; and a cleaning module, wherein:

said polishing module includes a roll brush extending in an axial direction and having a near end roll brush portion, a far end roll brush portion and a base roll brush portion disposed between the near end roll brush portion and the far end roll brush portion;

a driven roll located on a side reverse to said roll brush with the wafer between them and extending in the axial direction and having a near end driven roll portion, a far end driven roll portion and a base driven roll portion disposed between the near end driven roll portion and the far end driven roll portion;

a roll brush support having a roll brush bearing extending in the axial direction and sized and adapted to receive the near end roll brush portion of the roll brush to support the roll brush in a cantilevered manner so that the base roll brush portion and the far end roll brush portion project outwardly from the roll brush bearing;

a driven roll support having a driven roll bearing extending in the axial direction and sized and adapted to receive the near end driven roll portion of the driven roll brush to support the driven roll in a cantilevered manner so that the base driven roll portion and the far end driven roll portion project outwardly from the driven roll bearing;

roll brush adjustment means connected to the roll brush support and in contact with the near end roll brush portion of the roll brush to enable the axis of the roll brush to be tilted relative to a surface of the wafer to the cleaned, the roll brush adjustment means causing the near end roll brush portion of the roll brush to move in a seesaw fashion wherein, relative to the surface of the wafer to be cleaned, either the base roll brush portion is disposed lower than the far end roll brush portion, the far end roll brush portion is disposed lower than the base roll brush portion or the base roll brush portion and the far end roll brush portion are disposed equidistantly from the surface of the wafer to be cleaned; and driven roll adjustment means connected to the driven roll support and in contact with the near end driven roll portion of the driven roll to enable the axis of the driven roll to be tilted relative to the surface of the wafer to the cleaned, the driven roll adjustment means causing the near end driven roll portion of the driven roll to move in a seesaw fashion wherein, relative to the surface of the wafer to be cleaned, either the base driven roll portion is disposed lower than the far end driven roll portion, the far end driven roll portion is disposed lower than the base driven roll portion or the base driven roll portion and the far end driven roll portion are disposed equidistantly from the surface of the wafer to be cleaned.

13. A wafer cleaning device according to claim 12, wherein at least one of the roll brush adjustment means and the driven roll adjustment means includes a pair of dial adjusting screws.

14. A wafer cleaning device according to claim 13, wherein the pair of dial adjusting screws are axially spaced apart from one another.

15. A chemical mechanical polishing machine, comprising:

a polishing module; and a cleaning module, provided with a roll brush extending in an axial direction and having an end portion supported so that the roll brush can be rolled around said axis freely, the end portion of said roll brush being supported so that the roll brush can be displaced by adjustment means to enable the axis of said roll brush to be tilted to the cleaned surface of said wafer; and displacement detecting means for detecting a change of distance between the cleaned surface of said wafer and said roll brush.

16. A chemical mechanical polishing machine according to claim 15, wherein:

control means for adjusting said adjustment means based upon the result of detection by said displacement detecting means is provided.

17. A chemical mechanical polishing machine according to claim 9 or 15, wherein:

parallelism between the facing surface parallel to said axis of a rolled contact surface of said roll brush and the cleaned surface of said water is set to 0.1 mm or less.

* * * * *